(12) United States Patent
Watanabe

(10) Patent No.: US 7,391,264 B2
(45) Date of Patent: Jun. 24, 2008

(54) AMPLIFIER

(75) Inventor: Hiroshi Watanabe, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/290,709

(22) Filed: Nov. 30, 2005

(65) Prior Publication Data
US 2007/0273441 A1    Nov. 29, 2007

(30) Foreign Application Priority Data
Nov. 30, 2004  (JP)  ............................. 2004-346539

(51) Int. Cl.
H03F 3/45       (2006.01)
(52) U.S. Cl. ........................... 330/259; 330/51; 330/290
(58) Field of Classification Search .................... 330/9, 330/250, 290
See application file for complete search history.

(56) References Cited
U.S. PATENT DOCUMENTS
6,268,772 B1 *  7/2001  Chen ......................... 330/290

* cited by examiner

Primary Examiner—Khanh V Nguyen

(74) Attorney, Agent, or Firm—William B. Kempler; W. James Brady, III; Frederick J. Telecky, Jr.

(57) ABSTRACT

The objective of the invention is to automatically and dynamically change the slew rate corresponding to the change rate and amplitude of the input signal. In this operational amplifier, when voltage ($V_{in}$) of the input signal is high, or when it changes drastically, at the time the voltage difference between the input signal and the output signal ($V_{out}-V_{in}$) exceeds prescribed value ($V_F$), in constant current circuit (12), switch controller (22) turns ON switch (20). As a result, operation current amplifier (16) operates, and current ($I_E$) of constant current source (14) is amplified with a positive feedback loop. By means of positive feedback amplification of the current ($I_E$), slew rate (SR) rises drastically from the reference value that has been adopted, and output voltage ($V_{out}$) immediately follows input voltage ($V_{in}$). Then, when the voltage difference between the input signal and the output signal ($V_{out}-V_{in}$) falls to within prescribed value ($V_F$), switch controller (22) turns OFF switch (20), and the amplification function of operation current amplifier (16) stops.

15 Claims, 5 Drawing Sheets

AMPLIFIER

The present invention relates to an amplifier.

BACKGROUND

For an amplifier, especially an operational amplifier, the response speed and the operation frequency depend on the slew rate (SR). The slew rate refers to the maximum rate of rise/fall of the output, and it is represented by the following formula 1.

$$SR = k \cdot I_{CS}/C \quad (I)$$

Here, $I_{CS}$ represents the current value of the bias current in the operational amplifier. K represents a coefficient; $k \cdot I_{CS}$ represents the current value of the operational current for charge/discharge of the capacitor for phase compensation, and it is also the current value of the operational current fed to the transistor pertaining to the amplification. C represents approximately the capacitance of the phase-compensating capacitor, and, strictly, it represents a capacitance that also includes the parasitic capacitance of the transistor.

Consequently, in order to increase the response speed and the operation frequency, that is, in order to increase the slew rate, one may simply reduce the capacitance of the phase-compensating capacitor or increase the bias current. However, a scheme for reduction of the capacitance of the phase-compensating capacitor can hardly be adopted in consideration of the stability (to prevent oscillation), and it is especially undesirable for a voltage follower. On the other hand, as the bias current is increased, the power consumption rises. For present amplifier applications, there is a high demand for lower power consumption, and, in many cases, is not effective simply increasing the bias current.

As an example, for a source driver that drives the signal line of a liquid crystal display, there is a D/A converter (hereinafter to be referred to as "DAC") for converting the digital tone data that represent the display tone of each pixel to an analog tone voltage, and a voltage follower comprising an operational amplifier is set as a buffer amplifier in the final stage of the DAC for driving the signal line load with a relatively heavy capacitive property. In such application, the interval from the time of change of the input to the time it settles down to the target tone voltage (signal amplitude), that is, the settling time, is an important index in determining the usable frequency. Here, the settling time is determined by slew rate SR and the tone voltage (signal amplitude). For example, when slew rate SR is constant at 10 V/μs, the settling time when the signal amplitude is 4 V is 4 V/10 V/μs=0.4 μs, and the settling time when the signal amplitude is 1 V is 1 V/10 V/μs=0.1 μs. In this way, when slew rate SR is constant, the settling time depends on the signal amplitude, and, the higher the signal amplitude, the longer the settling time, and the poorer the settling characteristics.

Here, consider a scheme for changing bias current $I_{CS}$ proportional to slew rate SR. That is, when the signal amplitude is higher, bias current $I_{CS}$ is larger, and the slew rate SR and thus the rising speed become higher. When the signal amplitude is lower, bias current $I_{CS}$ is smaller. As a result, even when the amplitude is large, it is still possible to have a short settling time (improved settling characteristics) and, at the same time, it is possible to meet the demand for a lower power consumption.

In one aspect, the present invention addresses the aforementioned problems by providing an amplifier that can automatically and dynamically change the slew rate corresponding to the rate and amplitude of change of the input signal.

In another aspect, the present invention provides an amplifier wherein the settling time can be minimized, even for an input signal with a large amplitude.

In another aspect, the present invention provides an amplifier having low power consumption that can significantly improve the settling time characteristics.

SUMMARY

A described embodiment of the present invention comprises an amplifier circuit that amplifies the input signal with the desired amplification rate to generate an output signal, and a constant current circuit that feeds the operation current defining the slew rate to the amplifier circuit, keeps the operation current nearly constant when the difference between the input signal and the output signal is not larger than a prescribed value, and applies positive feedback to the operation current when the voltage difference is larger than the prescribed value.

For a described amplifier, when the voltage difference between the input signal and the output signal is not larger than the prescribed value, the constant current circuit keeps the operation current nearly constant, and the voltage of the output signal follows the input signal at a reference value slew rate, that is, the minimum value. When the voltage difference between the input signal and the output signal is larger than the prescribed value, the constant current circuit amplifies the operation current, so that it follows the input signal at a slew rate higher than the reference value. In this case, because the operation current is amplified with positive feedback, the slew rate rises steeply, and it is possible for the difference between the input signal and the output signal to instantly be within the prescribed value. In this way, when the input value rapidly changes at a rate higher than the prescribed value, microscopically, it is possible to repeat the following two modes alternately with a very short time interval: a mode in which the slew rate rises steeply when the voltage difference between the input signal and the output signal is larger than the prescribed value and a mode in which the slew rate is kept at the reference value when the voltage difference between the input signal and the output signal is within the prescribed value. As a result, macroscopically, it is possible to have the slew rate fit the rate of change of the voltage. As a result, the transition waveform or rate of the output signal can fit any transition waveform or rate of the input signal. Also, because the operation current is amplified only when the voltage difference between the input signal and the output signal is larger than the prescribed value, it is possible to reduce the total power consumption.

In one implementation of the present invention, an amplifier is provided that comprises a first transistor for generating the operation current, a second transistor that forms a first current mirror circuit together with the first transistor for biasing the first transistor, a constant current source for feeding a constant reference bias current to the second transistor, a third transistor that forms a second current mirror circuit together with the second transistor for generating the feedback current, and a positive feedback circuit for current that provides positive feedback of the current flowing in the third transistor to the second transistor and adds it to the reference bias current when the voltage difference between the input signal and the output signal is larger than the prescribed value.

With this configuration, when the voltage difference between the input signal and the output signal is larger than the prescribed value, due to the current mirror effect between the second transistor and the third transistor, a current (feedback current) flows that is proportional to the current flowing in the second transistor for bias at a prescribed ratio, and, as this feedback current is positively fed back to the second transistor via a positive feedback circuit for current, the current flowing in the second transistor is subjected to positive feedback, and it rises rapidly. As a result, due to the current mirror effect between the second transistor and the first transistor, the current flowing in the first transistor (the operation current) also rises rapidly. When the voltage difference between the input signal and the output signal is not larger than the prescribed value, the current from the third transistor is not fed back to the second transistor for bias. Consequently, only the reference bias current flows in the second transistor. As a result, the current flowing in the first transistor (operation current) is held constant.

Instead of the configuration of the first current mirror circuit composed of the second transistor for bias and the first transistor for generating the operation current, one may also adopt a scheme in which the first transistor is connected via the first current mirror circuit to the second transistor. Also, one may adopt a scheme in which instead of using the third transistor for generating the feedback current and the second transistor for bias to form the second current mirror circuit, the third transistor is connected to the second transistor via the second current mirror circuit.

In an example implementation of the present invention, the constant current positive feedback circuit may comprise a switch circuit that switches the third transistor ON when the difference in voltage between the input signal and the output signal is over a prescribed value, a fourth transistor connected in series to the third transistor that lets the reference bias current from a constant-current source flow through it, independent of the third transistor, and a fifth transistor that forms the third mirror circuit together with the fourth transistor and feeds a current proportional to the current flowing in the fourth transistor to the second transistor.

In such configuration, under action of the switching circuit, only when the voltage difference between the input signal and the output signal is larger than the prescribed value, is the feedback current generated by the third transistor. The feedback current flowing in the third transistor also flows in the fourth transistor, where it is added to the reference bias current. As a result, due to the current mirror effect between the fourth transistor and the fifth transistor, a current proportional to the synthesized current flowing in the fourth transistor flows to the fifth transistor. It then flows in the second transistor, too. Also, instead of the configuration of the third current mirror circuit composed of the fourth transistor and the fifth transistor, it is also possible to adopt a configuration in which the fifth transistor is connected via the third current mirror circuit to the fourth transistor. As a preferable state, the switching circuit has a sixth transistor connected between the third transistor and the fourth transistor, and there are a diode and a seventh transistor set in series between the third transistor and the fourth transistor and parallel to the sixth transistor. While the input signal is sent to the control terminal of the sixth transistor, the output signal is sent to the control terminal of the seventh transistor, and, the diode is ON when the voltage difference between the input signal and the output signal is larger than the prescribed value.

Also, in an implementation, the positive feedback circuit for current has the following parts: a fourth transistor connected in series to the third transistor, and a fifth transistor that is connected parallel to the constant current source and in series to the second transistor and forms the third mirror circuit together with the fourth transistor, and a switching circuit that turns ON the fifth transistor when the voltage difference between the input signal and the output signal is over a prescribed value.

In the configuration, a current always flows in the third transistor for generating the feedback current. Here, under functioning of the switching circuit, the fifth transistor is kept OFF. Consequently, the current from the third transistor is not fed back to the second transistor for bias. Only the reference bias current from the constant current source flows in the second transistor. When the voltage difference between the input signal and the output signal is larger than the prescribed value, and the switching circuit turns the fifth transistor ON, the current generated in the third transistor is fed back to a second transistor via a third current mirror circuit composed of a fourth transistor and a fifth transistor, and it is added to the reference bias current there. As a preferable scheme, the switching circuit has a sixth transistor connected between the third transistor and the fourth transistor, and a diode and a seventh transistor that are connected in series between the third transistor and the fourth transistor and are connected in parallel to the sixth transistor; the input signal is applied to the control terminal of the sixth transistor, and, together with it, the output signal is applied to the control terminal of the seventh transistor; and, when the voltage difference between the input signal and the output signal is larger than the prescribed value, the diode is ON.

As an embodiment of the present invention, the amplifier circuit has a differential input part that differentially inputs a pair of input signals, and the constant current circuit feeds the operation current to the differential input part. As another embodiment, it has a differential input part that differentially inputs a pair of input signals and an amplifier part that amplifies the signal output from the differential input part, and the operation current is fed to the constant current circuit. Also, the output signal may be fed back to be one of the pair of input signals. In addition, the amplification rate may be freely selected. For example, it may be unity.

DETAILED DESCRIPTION OF THE EMBODIMENT

For an example embodiment of the amplifier of the invention, with the aforementioned configuration and operation, it is possible to automatically and dynamically change the slew rate corresponding to the change rate and amplitude of the input signal. Also, the settling time can be minimized with respect to a large-amplitude input signal, and the settling time characteristics can be significantly improved. Also, when there is no change in the input signal or the change is small, because the operation is performed at a constant value slew rate, it is possible to reduce the power consumption.

In the following, an explanation will be given regarding an example embodiment of the present invention with reference to the annexed figures.

Figure 1:
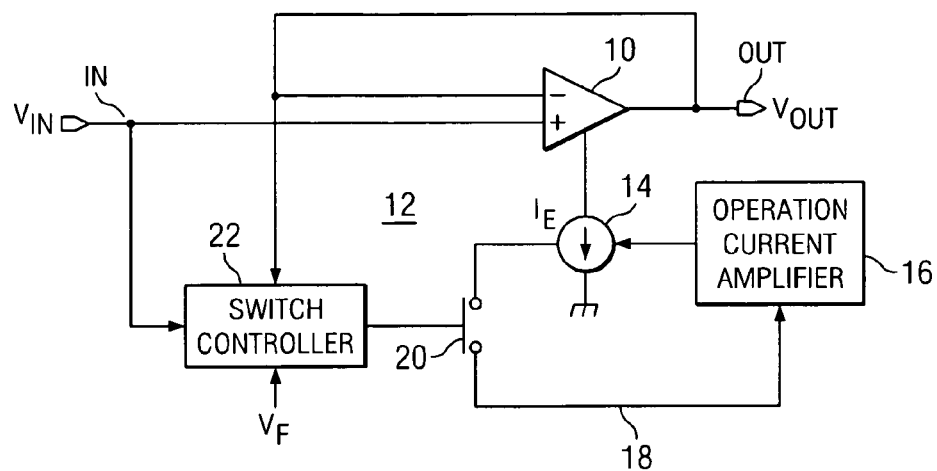
FIG. 1 is a circuit diagram illustrating the configuration of an operational amplifier as a preferable embodiment of the present invention.

FIG. 1 is a diagram illustrating the configuration of an operational amplifier in a preferable embodiment of the present invention. This operational amplifier has main circuit 10 containing a transistor for signal amplification, a capacitor for phase compensation, etc., and constant current circuit 12 that feeds the operation current to the main circuit 10. Non-inverted input terminal (+) and inverted input terminal (−) are connected to signal input terminal IN and signal output terminal OUT, respectively.

Constant current circuit 12 has constant current source 14 that generates operation current $I_E$ used in main circuit 10, operation current amplifier 16 for amplifying operation current $I_E$ of constant current source 14, switch 20 set in positive feedback loop 18 of the operation current amplifier 16, and switch controller 22 that controls ON/OFF of the switch 20. Here, switch controller 22 compares voltage $V_{in}$ of signal input terminal IN and voltage $V_{out}$ of signal output terminal OUT. If the voltage difference $|V_{out}-V_{in}|$ is smaller than prescribed value $V_F$, switch 20 is OFF. If voltage difference $|V_{out}-V_{in}|$ is larger than the prescribed value $V_F$, switch 20 is ON. Also, the various parts of constant current circuit 12 are shown apart from main circuit 10 to facilitate explanation in FIG. 1, yet, in practice, they are contained in main circuit 10 on the same chip. Also, the number of constant current sources 14 is not limited to one. Any number may be adopted.

The operational amplifier works as a voltage follower, and it outputs the input signal as is, that is, with a gain of unity. Consequently, when, for example, 2 V is applied as voltage $V_{in}$ of the input signal, output signal $V_{out}$ is almost 2 V. At this point (when stable), the input/output characteristics are the same as those of a conventional voltage follower. As will be explained in the following, the main characteristic feature of this operational amplifier is that the slew rate can be changed automatically and dynamically, corresponding to the change rate of voltage $V_{in}$ of the input signal, and that even when voltage $V_{in}$ of the input signal changes rapidly, voltage $V_{out}$ of the output signal still can follow input voltage $V_{in}$ at the shortest settling time. In addition, although it is a high-speed amplifier, the power consumption can be reduced. This is also a characteristic feature.

For the operational amplifier, when there is little or no change in the voltage of the input signal, that is, when the voltage difference between the input signal and the output signal $|V_{out}-V_{in}|$ is smaller than prescribed value $V_F$, in constant current circuit 12, switch controller 22 turns OFF switch 20. In this case, when positive feedback loop 18 is open (cut off), operation current amplifier 16 does not operate, and constant current source 14 feeds operation current $I_E$ with the reference or the minimum current value to the transistor in main circuit 10. Consequently, slew rate SR ($=k*I_E/C$) is kept at a constant reference value (minimum value). Here, k is a coefficient, and C represents approximately the capacitance of the phase-compensating capacitor contained in main circuit 10.

When voltage $V_{in}$ of the input signal is large, or it changes drastically, when the voltage difference between the input signal and the output signal $|V_{out}-V_{in}|$ is larger than the prescribed value $V_F$, in constant current circuit 12, switch controller 22 turns ON switch 20. As a result, operation current amplifier 16 operates, and current $I_E$ of constant current source 14 is amplified with a positive feedback loop. By means of the positive feedback amplification of the current $I_E$, slew rate SR rises drastically from the adopted reference value, and output voltage $V_{out}$ immediately follows input voltage $V_{in}$. Then, when the voltage difference between the input signal and the output signal $|V_{out}-V_{in}|$ decreases to within prescribed value $V_F$, switch controller 22 turns ON switch 20, and the amplification function of operation current amplifier 16 stops. As a result, operation current $I_E$ returns to the reference current value, and slew rate SR also returns to the reference value. However, whether or not slew rate SR returns to the reference value, since the voltage difference between the input signal and the output signal $|V_{out}-V_{in}|$ is again larger than the prescribed value $V_F$, switch 20 comes ON again, and the positive feedback current amplification is re-started by means of operation current amplifier 16. As a result, during the period when voltage $V_{in}$ of the input signal undergoes transition at a rate over a prescribed level, switch 20 repeatedly turns ON/OFF in a very short period, and in the balanced state with the relationship of $|V_{out}-V_{in}|=V_F$, the output signal undergoes transition with the same waveform or rate as the transition waveform of the input signal. Then, when input voltage $V_{in}$ reaches the target value and saturates, finally, output voltage $V_{out}$ follows input voltage $V_{in}$ at slew rate SR of the reference value, and reaches the same level.

In this way, for the operational amplifier of this embodiment, when there is no change in the voltage of the input signal or when the change is small, it responds at slew rate SR of the reference value or the minimum value. Then, when the input signal rapidly changes at a rate larger than the prescribed value, microscopically, it is possible to repeat the following two mode alternately with a very short time interval: a mode in which slew rate SR rises steeply towards infinity when the voltage difference between the input signal and the output signal $|V_{out}-V_{in}|$ is larger than the prescribed value $V_F$ and a mode in which slew rate SR is kept at the reference value when the voltage difference between the input signal and the output signal $|V_{out}-V_{in}|$ is within the prescribed value VF. As a result, macroscopically, it is possible for slew rate SR to fit the rate of change of the voltage. As a result, the transition waveform or rate of the output signal can fit any transition waveform or rate of the input signal. Also, because operation current $I_E$ is amplified only when the voltage difference between the input signal and the output signal $|V_{out}-V_{in}|$ is larger than the prescribed value $V_F$, it is possible to reduce the total power consumption.

Figure 2:
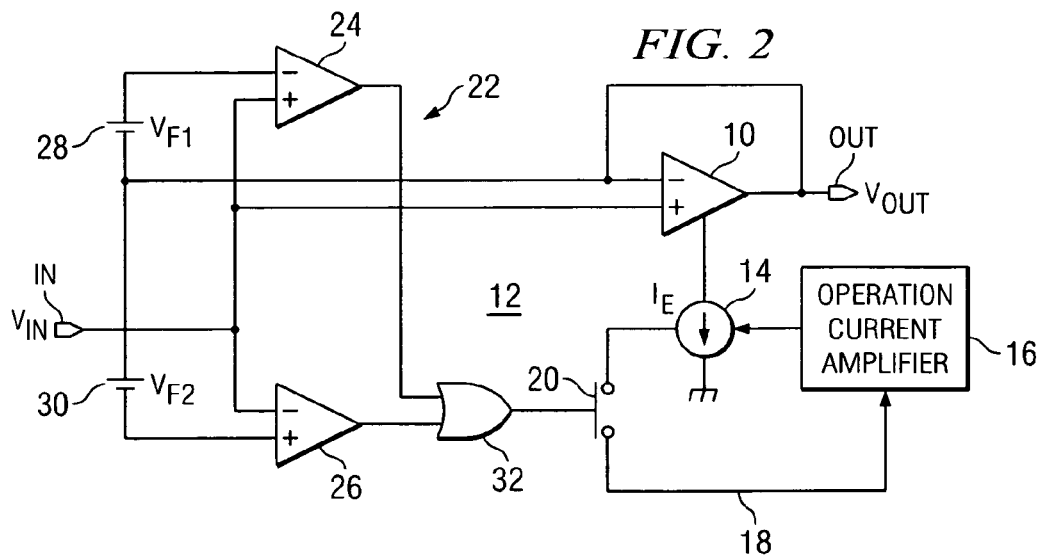
FIG. 2 is a circuit diagram illustrating an example of the configuration of a switch controller as an embodiment of the present invention.

FIG. 2 is a diagram illustrating an example of configuration of switch controller 22 in this embodiment. The switch controller 22 has a pair of comparators 24, 26, a pair of constant voltage generators 28, 30, and one OR gate 32. The constant voltage generators 28, 30 generate constant DC currents $V_{F1}$, $V_{F2}$ corresponding to set value $V_F$, respectively. Comparator 24 compares voltage $V_{in}$ of the input signal with voltage $(V_{out}+V_{F1})$ obtained by adding voltage $V_{F1}$ of constant voltage generator 28 to voltage $V_{out}$ of the output signal. When $V_{in}>(V_{out}+V_{F1})$, an H-level output is generated. When $V_{in}\leq(V_{out}+V_{F1})$, an L-level output is generated. The output of the comparator 24 becomes the H-level when voltage $V_{in}$ of the input signal rises. Comparator 26 compares voltage $V_{in}$ of the input signal with voltage $(V_{out}-V_{F2})$ obtained by subtracting voltage $V_{F2}$ of constant voltage generator 30 from voltage $V_{out}$ of the output signal. If $V_{in}<(V_{out}-V_{F1})$, an H-level output is generated. If $V_{in}\geq(V_{out}-V_{F1})$, an L-level output is generated. When the output of the comparator 26 goes to the H-level, voltage $V_{in}$ of the input signal falls. The outputs of two comparators 24, 26 are sent as control signals to switch 20 via OR gate 32. Switch 20 responds to an H-level control signal and is turned ON, and it responds to an L-level control signal and is turned OFF.

Figure 3:
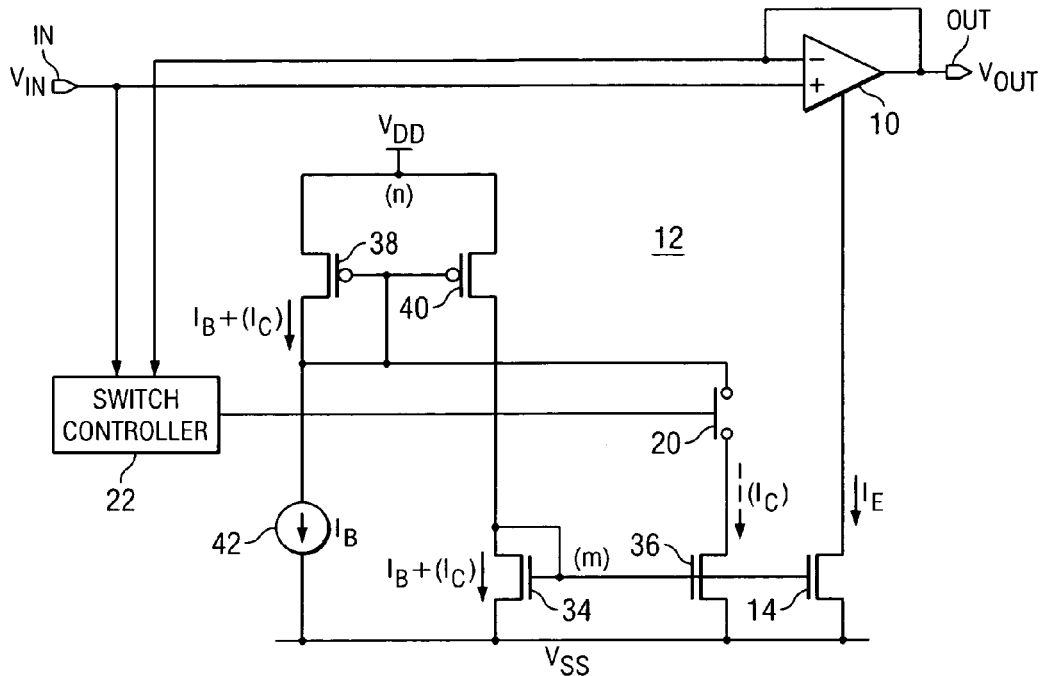
FIG. 3 is a circuit diagram illustrating the configuration of an operational current amplifier in an embodiment.

FIG. 3 is a diagram illustrating the configuration of operation current amplifier 16 in an embodiment. In this example, constant current source 14 for generating the operation current is comprised of an NMOS transistor. The operation current amplifier 16 has PMOS transistor 40 and NMOS transistor 34 connected in series in between a terminal of positive-sign power source voltage $V_{DD}$ and a terminal of negative-sign power source voltage $V_{SS}$, has PMOS transistor 38 and constant current source 42 connected in series, and has NMOS transistor 36 connected in series to PMOS transistor 38 via switch 20 and parallel to constant current source 42. Here, NMOS transistor 34 is an NMOS transistor for bias of constant current source 14 as the constant current source for generating the operation current; NMOS transistor 36 is a transistor for generating the feedback current; and PMOS transistors 38, 40 are transistors that form a positive feedback circuit for current.

Constant current source 42 feeds prescribed reference bias current $I_B$ to PMOS transistor 38. PMOS transistor 40 has its drain potential and gate potential connected to those of PMOS transistor 38, respectively, as common parts to form a current mirror circuit. Current mirror ratio n of this current mirror circuit 38, 40 can be freely selected. corresponding to the ratio of the size (channel width) of two transistors 38, 40. For example, by selecting n=1, it is possible for a current of the same magnitude as that flowing in PMOS transistor 38 to flow in PMOS transistor 40.

NMOS transistor 34 for bias has its drain and gate connected to those of NMOS transistor 14 for generating the operation current and NMOS transistor 36 for generating the feedback current as common parts to form a current mirror circuit. Here, the current mirror ratio k of current mirror circuit 34, 14 can be freely selected. The current mirror ratio m of current mirror circuit 34, 36 also can be freely selected. Here, in order to increase the feedback current, a large value for m is preferred. For example, one may select m=3. Switch 20 is connected in series to NMOS transistor 36 for generating the feedback current, and in parallel to constant current source 42 for reference bias.

In the following, an explanation will be given regarding the operation of operation current amplifier 16 shown in FIG. 3. When the voltage difference between the input signal and the output signal $|V_{out}-V_{in}|$ is smaller than prescribed value $V_F$ ($V_{F1}$, $V_{F2}$), switch 20 is turned OFF, and NMOS transistor 36 for generating feedback current is also turned OFF. Consequently, only reference bias current $I_B$ from constant current source 42 flows in PMOS transistor 38, and, due to the current mirror effect, a current equal to reference bias current $I_B$ flows in PMOS transistor 40 and then in NMOS transistor 34 for bias. As a result, operation current $I_E$ (=$k*I_B$) obtained by multiplying current mirror ratio k by reference bias current $I_B$ flows in NMOS transistor 14 for generating the operation current of main circuit 10. In this case, slew rate SR is SR=$k*I_E/C$, and it is held constant.

When voltage $V_{in}$ of the input signal is high or changes drastically, at the time the voltage difference between the input signal and the output signal $|V_{out}-V_{in}|$ rises above prescribed value $V_F$ ($V_{F1}$, $V_{F2}$), switch 20 is turned ON, and, with NMOS transistor 36 turned ON, it is connected to PMOS transistor 38. As a result, due to the current mirror effect between NMOS transistors 34, 36, a current $I_C$ flows in NMOS transistor 36, equal to the product of current mirror ratio m and current $I_B$ flowing in NMOS transistor 34. Current $I_C$ (=$m*I_B$) that flows in the NMOS transistor 36 also flows in PMOS transistor 38. That is, in PMOS transistor 38, a synthesis current ($I_B+I_C$)=($I_B+m*I_B$) flows that was obtained as a sum of reference bias current $I_B$ to constant current source 42 and current $I_C$ (=$m*I_B$) to NMOS transistor 36. As a result, due to the current mirror effect between PMOS transistors 38, 40, a current of the same magnitude as that flowing in PMOS transistor 38 ($I_B+m*I_B$) flows in PMOS transistor 40, and then also in NMOS transistor 34.

In this way, when the current flowing in NMOS transistor 34 for bias rises from $I_B$ to ($I_B+I_C$), that is, ($I_B+m*I_B$), due to the current mirror effect between NMOS transistors 34, 36, an m-fold current $I_C$, that is, $m(m+1)*I_B$, flows in NMOS transistor 36. Then, the current $I_C$ or $m(m+1)*I_B$ is positively fed back via PMOS transistors 38, 40 to NMOS transistor 34 for bias, and the current flowing in NMOS transistor 34 increases from ($I_B+m*I_B$) to ($I_B+I_C$), that is, {$I_B+m(m+1)*I_B$}.

In this way, the current flowing in NMOS transistor 34 for bias rises rapidly due to positive feedback amplification. As a result, due to the current mirror effect with NMOS transistor 34, driving current $I_E$ generated by NMOS transistor 14 also rises drastically.

As explained above, in the operation current amplifier 16, when the voltage difference between the input signal and the output signal $|V_{out}-V_{in}|$ is larger than the prescribed value $V_F$ ($V_{F1}$, $V_{F2}$), switch 20 is turned ON, and the current flowing in NMOS transistor 34 for bias is detected by NMOS transistor 36 with the current mirror effect, and feedback current $I_C$ generated in NMOS transistor 36 is positively fed back to NMOS transistor 34 via current mirror circuit 38, 40. In this way, the current flowing in NMOS transistor 34 is subjected to positive feedback and is amplified. Then, operation current $I_E$ flowing in NMOS transistor 14 as the constant current source for generating the operation current is also subjected to positive feedback and is amplified. As a result, slew rate SR rises drastically, and output voltage $V_{out}$ changes or transits at a rate much higher than that of input voltage $V_{in}$. Consequently, the voltage difference between the input signal and the output signal $|V_{out}-V_{in}|$ falls below prescribed value $V_F$ instantly or within a very short time, and switch 20 is turned OFF by switch controller 22. When switch 20 is turned OFF, the positive feedback current amplification is stopped, and slew rate SR returns to the reference value.

For operation current amplifier 16 shown in FIG. 3, because no current flows in NMOS transistor 36 for generating the feedback current when switch 20 is held OFF, it is beneficial to reduction of power consumption.

Figure 4:
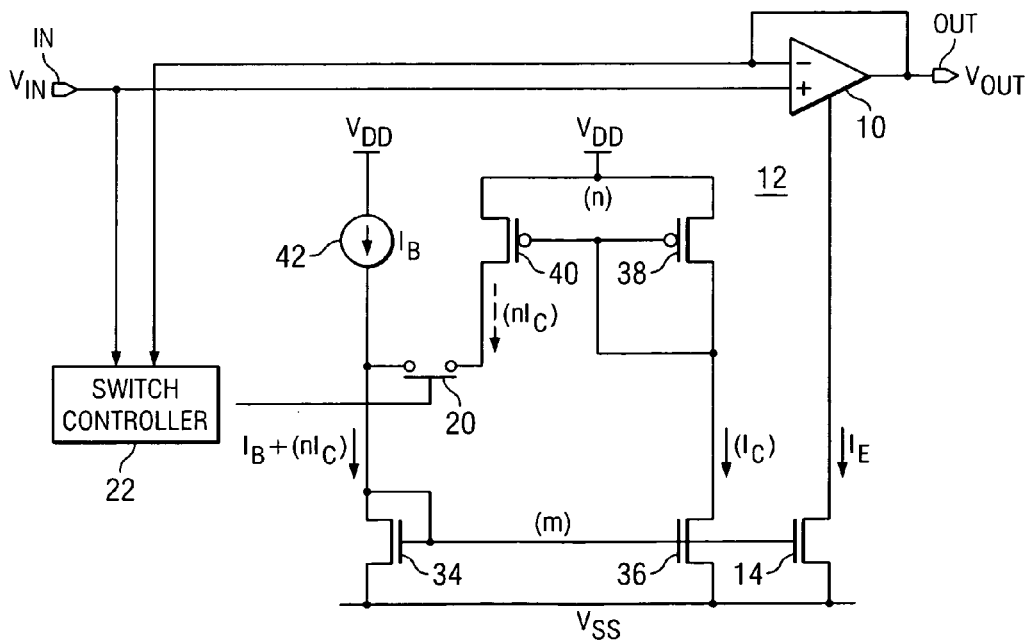
FIG. 4 is a circuit diagram illustrating the configuration of an operational current amplifier in an embodiment.

FIG. 4 is a diagram illustrating another embodiment of operation current amplifier 16. In this embodiment, between a terminal of positive-sign power source voltage $V_{DD}$ and a terminal of negative-sign power source voltage $V_{SS}$, PMOS transistor 38 and NMOS transistor 36 are connected in series, PMOS transistor 40 and NMOS transistor 34 are connected in series via switch 20, and constant current source 42 for the reference bias is connected in parallel to PMOS transistor 40 and in series to NMOS transistor 34. In this embodiment, too, NMOS transistor 34 is a transistor for biasing NMOS transistor 14 for operation current generation, NMOS transistor 36 is a transistor for generating feedback current, and PMOS transistors 38, 40 are transistors for forming the positive feedback circuit for current. Constant current source 14 for generating the operation current is made of an NMOS transistor. Also, PMOS transistors 38, 40 form a current mirror circuit, and NMOS transistors 34, 36, 14 form a current mirror circuit. Switch 20 is connected in series to PMOS transistor 40, and it is parallel to constant current source 42. Constant current source 42 directly feeds prescribed reference bias current $I_B$ to NMOS transistor 34 for bias.

In driving current amplifier 16 shown in FIG. 4, even when the voltage difference between the input signal and the output signal $|V_{out}-V_{in}|$ is within prescribed value $V_F$ ($V_{F1}$, $V_{F2}$) and switch 20 is turned OFF, current $I_C$ flows in NMOS transistor 36 for generating feedback current. This current $I_C$ is due to the current mirror effect between NMOS transistors 34, 36, and it is proportional to the current flowing in NMOS transistor 34 for bias, that is, reference bias current $I_B$. In order to reduce the current consumption due to standby current $I_C$, it is preferable if the value of current mirror ratio m of current mirror circuit 34, 36 is small, such as 1 or smaller. In this way, even when current $I_C$ flows in NMOS transistor 36 for generating the feedback current, switch 20 is turned OFF, so that PMOS transistor 40 has no current flowing in it, and only reference bias current $I_B$ from constant current source 42 flows to NMOS transistor 34 for bias. Consequently, for generating the operation current, an operation current $I_E$ (=$k*I_B$) as a product of current mirror ratio k and reference bias current $I_B$ flows in NMOS transistor 14. Consequently, slew rate SR is held constant at SR=$k*I_B/C$.

In this operation current amplifier 16, when the voltage difference between the input signal and the output signal $|V_{out}-V_{in}|$ is larger than the prescribed value $V_F$($V_{F1}$, $V_{F2}$), switch 20 is turned ON. As a result, current $I_C$ flowing in NMOS transistor 36 provides positive feedback to NMOS transistor 34 for bias via current mirror circuit 38, 40. Here, current mirror ratio n of current mirror circuit 38, 40 is preferably selected to have a magnitude that can compensate current mirror ratio m of current mirror circuit 34, 36. For example, one may select n=3.

In this way, in this embodiment, too, when switch 20 is turned ON, positive feedback is applied to operation current amplifier 16 to perform current amplification, so that the current flowing in NMOS transistor 34 for bias rises drastically, and operation current $I_E$ in NMOS transistor 14 for generating the operation current and biased by NMOS transistor 34 also rises drastically. As a result, slew rate SR rises instantly, and output voltage $V_{out}$ makes changes or transits at a rate much higher than that of input voltage $V_{in}$. Consequently, the voltage difference between the input signal and the output signal $|V_{out}-V_{in}|$ falls below prescribed value $V_F$ instantly or in a very short time, and switch 20 is turned OFF. When switch 20 is turned OFF, as explained above, the positive feedback current amplification is stopped, and slew rate SR returns to the reference value.

Constant current circuit 12 shown in FIGS. 3 and 4 is assumed to be the of sink type with respect to main circuit 10. However, it may also be of the source type. That is, it is possible to change to the source type by replacing the PMOS transistors (such as 38, 40) of the various parts with NMOS transistors, and by replacing the NMOS transistors (such as 34, 36, 14) of the various parts with PMOS transistors.

In the embodiment shown in FIGS. 3 and 4, transistor 34 for bias and transistor 36 for generating feedback current are directly connected together to form a current mirror circuit. However, one may also adopt a scheme in which two transistors 34, 36 are indirectly connected to each other via a current mirror circuit containing other transistors. Similarly, one may also adopt a scheme in which transistor 34 for bias and transistor 14 for generating the operation current are indirectly connected to each other via a current mirror circuit containing other transistors. Also, in the positive feedback circuit for current, the configuration of one current mirror circuit 38, 40 is merely an example, and one may also adopt a scheme in which two or more current mirror circuits are contained.

Figure 5A:
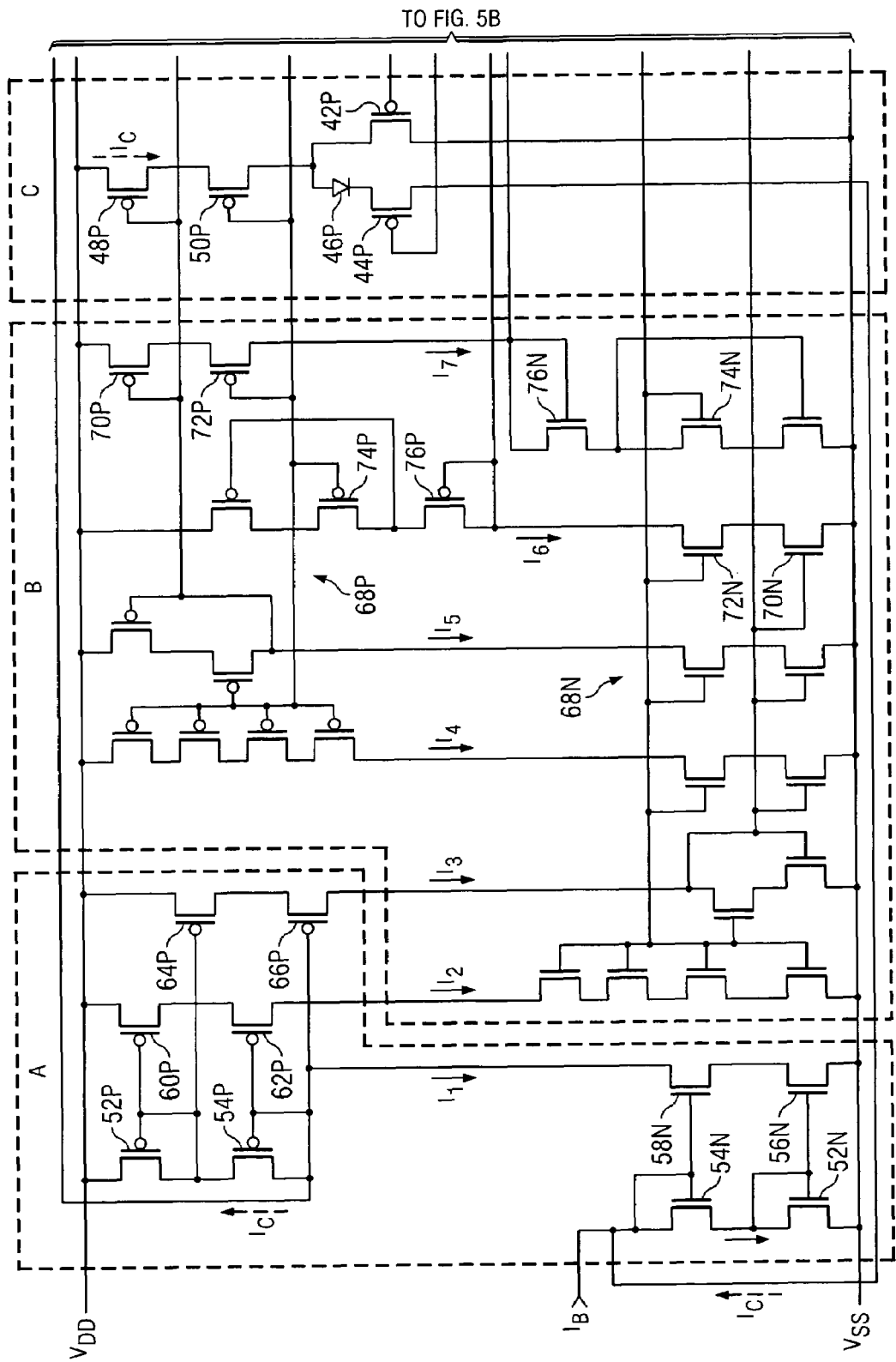
FIG. 5 is a circuit diagram illustrating the specific configuration of an operational amplifier in an embodiment.
Figure 5B:
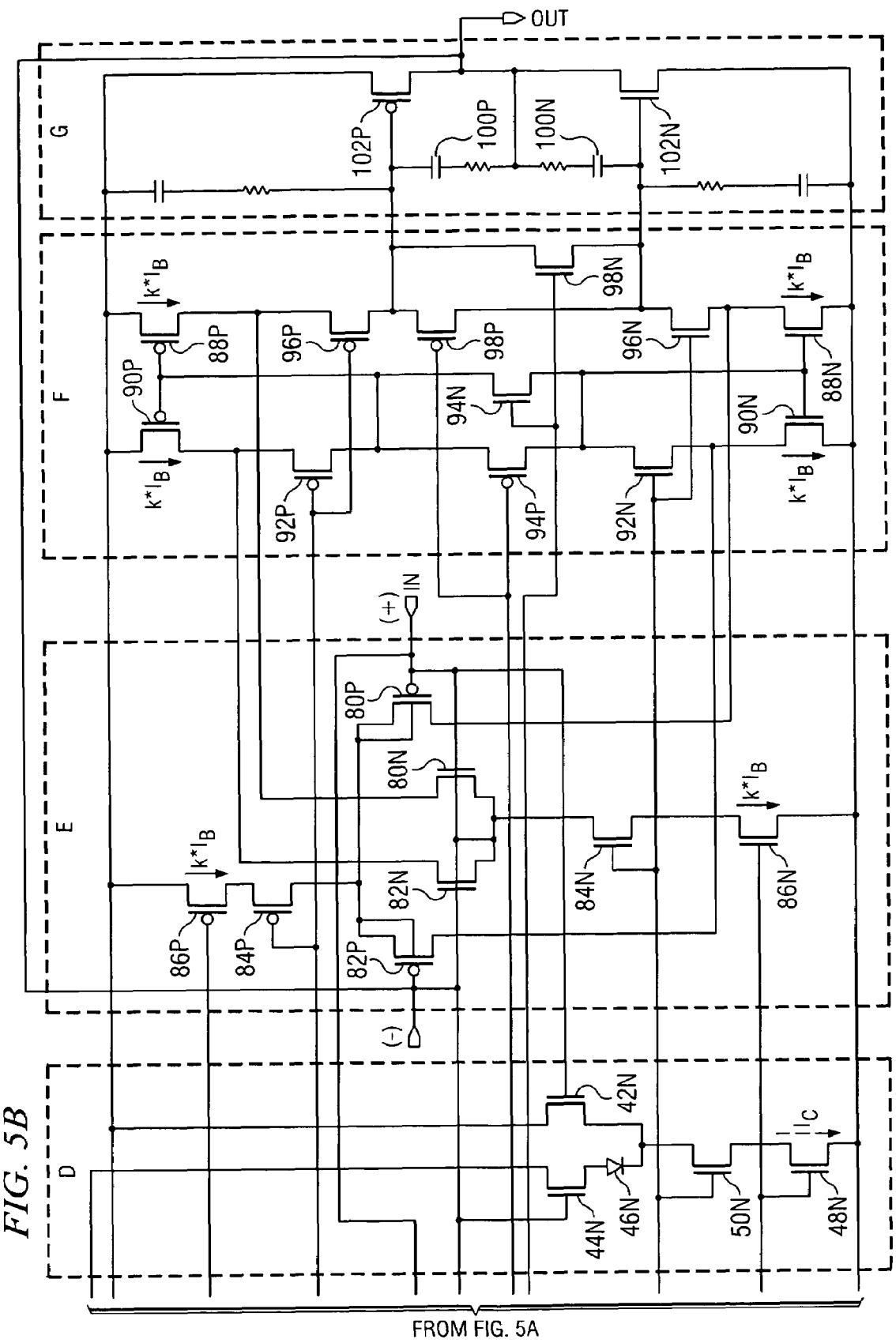

FIG. 5 is a diagram illustrating a more specific example of configuration of an operational amplifier in an embodiment. This operational amplifier is composed of blocks A, B, C, D, E, F, which form a rail-to-rail output type of voltage follower.

Block C contains a configuration corresponding to comparator 24 and reference voltage generator 28 shown in FIG. 2 and to switch 20 and NMOS transistor 36 for generating feedback current shown in FIG. 3. That is, the pair of PMOS transistors 42P, 44P in differential connection correspond to comparator 24; diode 46P corresponds to reference voltage generator 28 and switch 20; and cascade-connected PMOS transistors 48P, 50P correspond to NMOS transistor 36 for generating feedback current.

More specifically, the gate of PMOS transistor 42P is connected to signal input terminal IN or non-inverted input terminal (+), and the gate of PMOS transistor 44P is connected to signal output terminal OUT or inverted input terminal (−). For cascade-connected PMOS transistors 48P, 50P, the source of PMOS transistor 48P is connected to a terminal of positive-sign power source voltage $V_{DD}$, and the drain of PMOS transistor 50P is directly connected to the source of PMOS transistor 42P, while it is connected via diode 46P to the source of PMOS transistor 44P. The drain of PMOS transistor 42P is connected to a terminal of negative-sign power source voltage $V_{SS}$. The drain of PMOS transistor 44P is connected to a terminal of negative-sign power source voltage $V_{SS}$ via cascade-connected NMOS transistors 54N, 52N in block A. Here, cascade-connected NMOS transistors 54N, 52N form the positive feedback circuit for current, and they correspond to PMOS transistor 38 shown in FIG. 3.

When voltage $V_{in}$ of the input signal is lower than the value of ($V_{out}+V_{F1}$) as the sum of voltage $V_{out}$ of the output signal and ON voltage $V_{F1}$ of diode 46P, diode 46P is held in the non-conductive state. When voltage $V_{in}$ of the input signal is higher than ($V_{out}+V_{F1}$), diode 46P and PMOS transistor 44P are turned ON, and current $I_C$ flows from positive-sign power source voltage $V_{DD}$ to negative-sign power source voltage $V_{SS}$ via cascade PMOS transistors 48P, 50P, diode 46P, PMOS transistor 44P and cascade NMOS transistors 54N, 52N in block A. Here, PMOS transistors 48P, 50P for generating feedback current form a current mirror circuit together with the group of PMOS transistors <68P> in block B corresponding to NMOS transistor 34 for bias shown in FIG. 3, especially together with cascade-connected PMOS transistors 70P, 72P.

Block D contains a configuration corresponding to comparator 26 and reference voltage generator 30 shown in FIG. 2 and switch 20 and NMOS transistor 36 for generating feedback current shown in FIGS. 3 and 4. That is, the pair of PMOS transistors 42N, 44N in differential connection correspond to comparator 26; diode 46N corresponds to reference voltage generator 30 and switch 20; and cascade-connected NMOS transistors 48N, 50N correspond to NMOS transistor 36 for generating feedback current.

More specifically, the gate of NMOS transistor 42N is connected to signal input terminal IN or non-inverted input terminal (+), and the gate of NMOS transistor 44N is connected to signal output terminal OUT or inverted input terminal (−). For cascade-connected NMOS transistors 48N, 50N, the source of NMOS transistor 48N is connected to a terminal of negative-sign power source voltage $V_{SS}$, and the drain of NMOS transistor 50N is directly connected to the source of NMOS transistor 42N, while it is connected via diode 46N to the source of NMOS transistor 44N. The drain of NMOS transistor 42N is connected to a terminal of positive-sign power source voltage $V_{DD}$. The drain of NMOS transistor 44N is connected to a terminal of positive-sign power source voltage $V_{DD}$ via cascade-connected PMOS transistors 54P, 52P in block A. Here, cascade-connected PMOS transistors 54P, 52P form the positive feedback circuit for current, and they correspond to PMOS transistor 38 shown in FIG. 3.

When voltage $V_{in}$ of the input signal is higher than the value of $(V_{out}-V_{F1})$ obtained by subtracting ON voltage $V_{F1}$ of diode 46N from voltage $V_{out}$ of the output signal, diode 46N is held in the non-conductive state. When voltage $V_{in}$ of the input signal is lower than $(V_{out}-V_{F1})$, NMOS transistor 44N and diode 46N are turned ON, and current $I_C$ flows from positive-sign power source voltage $V_{DD}$ to negative-sign power source voltage $V_{SS}$ via cascade PMOS transistors 52P, 54P, NMOS transistor 44N, diode 46N, and cascade NMOS transistors 50N, 48N. Here, NMOS transistors 48N, 50N for generating feedback current form a current mirror circuit together with a group of NMOS transistors <68N> in block B corresponding to NMOS transistor 34 for bias shown in FIG. 3, especially cascade-connected PMOS transistors 70P, 72P.

Block E is the differential input part, and it contains the differential input circuit of the synchronization system and the differential input circuit of the source system. The differential input circuit of the synchronization system has a pair of NMOS transistors 80N, 82N connected in differential configuration, and cascade NMOS transistors 84N, 86N connected between the sources of the NMOS transistors 80N, 82N and negative-sign power source voltage $V_{SS}$. Here, cascade NMOS transistors 84N, 86N form constant current source 14 that feeds operation current to NMOS transistors 80N, 82N, and they form a current mirror circuit together with a group of NMOS transistors <68N> in block B, especially cascade-connected NMOS transistors 72N, 70N, equivalent to NMOS transistor 34 for bias shown in FIG. 3.

The differential input circuit of the source system has a pair of differential-connected PMOS transistors 80P, 82P and cascade PMOS transistors 84P, 86P connected between the sources of the PMOS transistors 80P, 82P and positive-sign power source voltage terminal $V_{DD}$. Here, cascade PMOS transistors 84P, 86P form constant current source 14 for feeding operation current to PMOS transistors 80P, 82P, and they form a current mirror circuit together with a group of PMOS transistors <68P> in block B, especially cascade-connected PMOS transistors 72P, 70P, equivalent to NMOS transistor 34 for bias shown in FIG. 3.

Block F is a voltage amplification part or buffer part. It amplifies the signal fetched from the differential input part of block E with an amplification rate of 1 or higher. It performs charge/discharge of phase-compensating capacitors 100P, 100N in output circuit G, and drives PMOS transistor 102P and NMOS transistor 102N for output.

In blocks E, F, operation current $I_E$ (=k*$I_B$) from PMOS transistors 86P, 84P of the constant current source is divided into $I_E/2$ that flow to differential input PMOS transistors 80P, 82P and NMOS transistors 88N, 90N. On the other hand, operation current $I_E$, which is pulled from differential input NMOS transistors 80N, 82N to NMOS transistors 84N, 86N of the constant current source at $I_E/2$, feeds at $I_E/2$ from PMOS transistors 88P, 90P.

Block F is a circuit that amplifies the current as a voltage. It cascade-amplifies the differential current fed from block E by means of the current mirror circuit.

Block A contains a positive feedback circuit. More specifically, cascade NMOS transistors 52N, 54N form a current mirror circuit together with cascade NMOS transistors 56N, 58N. Here, cascade NMOS transistors 52N, 54N correspond to PMOS transistor 38 shown in FIG. 3 as explained above, and cascade NMOS transistors 56N, 58N correspond to PMOS transistor 40 shown in FIG. 3.

Current $I_1$ flowing in cascade NMOS transistors 56N, 58N is also the current that flows in cascade PMOS transistors 52P, 54P. For example, it is $I_B+I_C$. As explained above, cascade PMOS transistors 52P, 54P correspond to PMOS transistor 38 shown in FIG. 3, and, together with cascade PMOS transistors 60P, 62P, they form a current mirror circuit. They also form a current mirror circuit together with cascade transistors 64P, 66P. Here, cascade PMOS transistors 60P, 62P, 64P, 66P correspond to PMOS transistor 40 shown in FIG. 3.

Block B contains a group of PMOS transistors <68P> and NMOS transistors <68N> of cascade connection and forming the transistors for bias, and, with prescribed ratios to current $I_1$ of block A, currents $I_2$, $I_3$, $I_4$, $I_5$, $I_6$, $I_7$ flow in the various parts, respectively.

Figure 6:
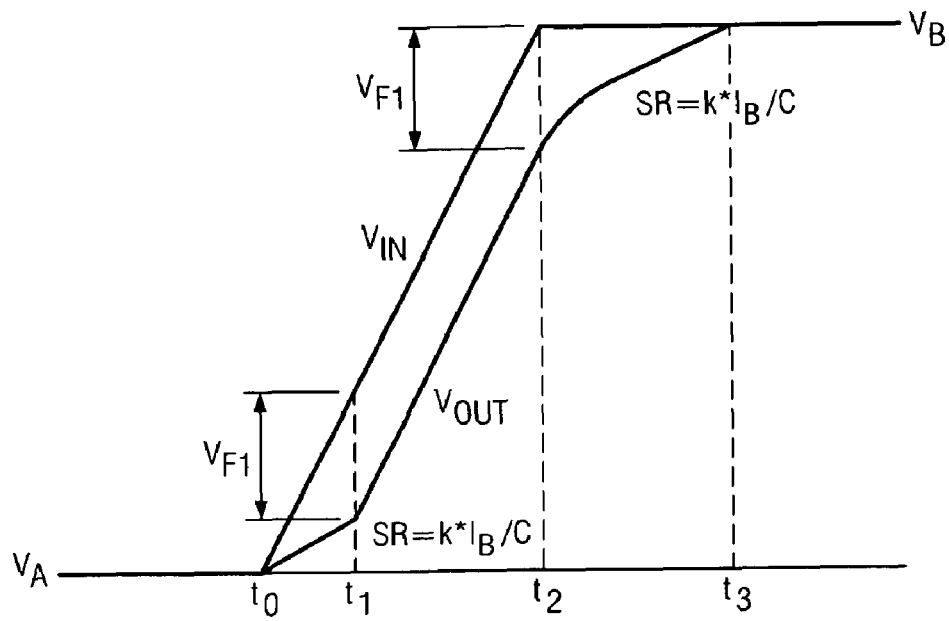
FIG. 6 is a diagram illustrating input/output transition waveforms when the signal rises in the operational amplifier of the embodiment.

FIG. 6 is a diagram illustrating transition waveforms of the input signal and output signal obtained when the input signal rises stepwise from stable value $V_A$ to a higher stable value $V_B$ in the operational amplifier (FIG. 5). Immediately after the start in the rise of the input signal ($t_0$~$t_1$), the voltage difference between the input signal and the output signal $|V_{out}-V_{in}|$ is within prescribed value $V_F$ ($V_{F1}$, $V_{F2}$), and the output signal follows the input signal at the slew rate SR of the reference value (k*$I_E/C$).

At time ($t_1$) when the difference between voltage $V_{in}$ of the input signal and voltage $V_{out}$ of the output signal increases to the prescribed value $V_{F1}$, diode 46P and PMOS transistor 44P of block C are turned ON, and feedback current IC generated in cascade PMOS transistors 48P, 50P is sent to positive feedback circuit for current of block A. The bias current in block B, and thus the operation currents in blocks E, F, are subjected to positive feedback and are amplified. Then, as explained above, microscopically, it is possible to repeat the following two modes alternately with a very short time interval: a mode in which the slew rate SR rises steeply towards infinity when the voltage difference between the input signal and the output signal $|V_{out}-V_{in}|$ is larger than the prescribed value $V_{F1}$ and a mode in which the slew rate SR is kept at the reference value when the voltage difference between the input signal and the output signal $|V_{out}-V_{in}|$ is within the prescribed value $V_{F1}$. As a result, macroscopically, it is possible for the slew rate SR to fit the rate of change of input voltage $V_{in}$. As a result, it is possible to maintain the balanced state of $|V_{out}-V_{in}|=V_{F1}$.

Then, when voltage $V_{in}$ of the input signal reaches target value $V_B$ ($t_2$), the voltage difference between the input signal and the output signal $|V_{out}-V_{in}|$ converges to within the steady prescribed value $V_{F1}$, and the output signal follows the input signal at the slew rate SR of the reference value (k*$I_E/C$) ($t_3$).

Figure 7:
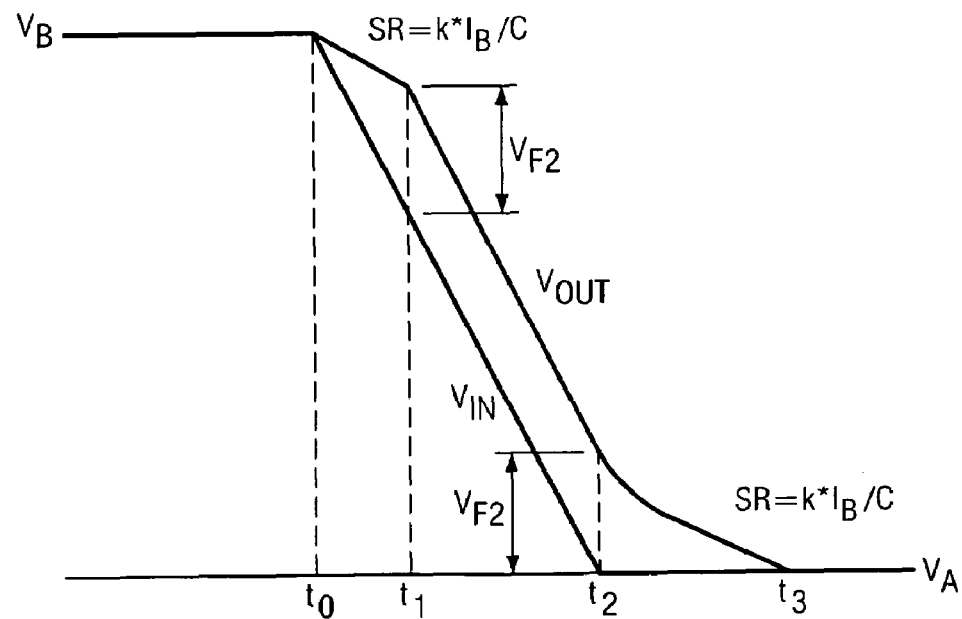
FIG. 7 is a diagram illustrating input/output transition waveforms when the signal falls in the operational amplifier of the embodiment.

FIG. 7 is a diagram illustrating the transition waveforms of the input signal and output signal obtained when the input signal falls stepwise from stable value $V_B$ to a lower stable value $V_A$ in the operational amplifier (FIG. 5). In this case, when the voltage difference between the input signal and the output signal $|V_{out}-V_{in}|$ is larger than the prescribed value $V_{F1}$, NMOS transistor 44N and diode 46N of block D are turned ON, and, feedback current IC generated by cascade NMOS transistors 50N, 48N is fed to the positive feedback circuit for current of block A, and the bias current in block B, and then the operation currents in blocks E, F, are subjected to positive feedback and are amplified. As shown in this figure, the same transition characteristics as those in rise (FIG. 6) can be realized.

The amplifier of the present invention can be used preferably in high-speed type amplifiers and DACS. Especially, in the application of DACS, it is possible to change the slew rate dynamically in large-amplitude output and fit the rate of the input signal. Consequently, the settling time of the output buffer, which becomes an element in determining the operation frequency, decreases, and high-speed operation frequency characteristics can be realized. Also, when there is no change in the input voltage, or when the change is small, no amplification of the bias current is carried out. Consequently, standby is possible at a lower power consumption. Because the current is increased and the frequency characteristics of the amplifier are beefed up only when needed, the power consumption of the system can be optimized.

Also, the amplifier of the present invention is not limited to an operational amplifier and voltage follower. It may be adopted in any amplifier containing a constant current circuit for feeding the operation current.

Those skilled in the art to which the invention relates will appreciate that additions, deletions, substitutions and changes can be made to the described embodiments without departing from the spirit and scope of the invention intended to be encompassed hereby.

The invention claimed is:

1. An amplifier comprising:
   an amplifier circuit that amplifies an input signal with a desired amplification rate to generate an output signal; and
   a constant current circuit that feeds an operation current defining a slew rate to said amplifier circuit, keeps said operation current nearly constant when a voltage difference between said input signal and said output signal is not larger than a prescribed value, and applies positive feedback to said operation current when said voltage difference is larger than said prescribed value.

2. The amplifier described in claim 1, wherein said constant current circuit comprises:
   a first transistor for generating said operation current;
   a second transistor that forms a first current mirror circuit together with said first transistor for biasing said first transistor;
   a constant current source for feeding a constant reference bias current to said second transistor;
   a third transistor that forms a second current mirror circuit together with said second transistor for generating a feedback current; and
   a positive feedback circuit for current that provides positive feedback of a current flowing in said third transistor to said second transistor and adds it to said constant reference bias current when the voltage difference between said input signal and said output signal is larger than said prescribed value.

3. The amplifier described in claim 1, wherein said constant current circuit comprises:
   a first transistor for generating said operation current;
   a second transistor that is connected to the first transistor via a first current mirror circuit for biasing said first transistor;
   a constant current source for feeding a constant reference bias current to said second transistor;
   a third transistor that forms a second current mirror circuit together with said second transistor for generating a feedback current; and
   a positive feedback circuit for current that provides positive feedback of a current flowing in said third transistor to said second transistor and adds it to said constant reference bias current when the voltage difference between said input signal and said output signal is larger than said prescribed value.

4. The amplifier described in claim 1, wherein said constant current circuit comprises:
   a first transistor for generating said operation current;
   a second transistor that forms a first current mirror circuit together with said first transistor for biasing said first transistor;
   a constant current source for feeding a constant reference bias current to said second transistor;
   a third transistor that is connected to said second transistor via a second current mirror circuit for generating a feedback current; and
   a positive feedback circuit for current that provides positive feedback of a current flowing in said third transistor to said second transistor and adds it to said constant reference bias current when the voltage difference between said input signal and said output signal is larger than said prescribed value.

5. The amplifier described in claim 1, wherein said constant current circuit comprises:
   a first transistor for generating said operation current;
   a second transistor that is connected to said first transistor via a first current mirror circuit for biasing said first transistor;
   a constant current source for feeding a constant reference bias current to said second transistor;
   a third transistor that is connected to said second transistor via a second current mirror circuit for generating the feedback current; and
   a positive feedback circuit for current that provides positive feedback of a current flowing in said third transistor to said second transistor and adds it to said constant reference bias current when the voltage difference between said input signal and said output signal is larger than said prescribed value.

6. The amplifier described in claim 2, wherein said positive feedback circuit for current comprises:
   a switching circuit that feeds power to said third transistor when the voltage difference between said input signal and said output signal is larger than said prescribed value;
   a fourth transistor that is connected in series to said third transistor and lets said constant reference bias current from said constant current source pass through it independent of said third transistor; and
   a fifth transistor that forms a third mirror circuit with said fourth transistor, and feeds a current proportional to a current flowing in said fourth transistor to said second transistor.

7. The amplifier described in any of claim 2, wherein said positive feedback circuit for current comprises:
   a switching circuit that feeds power to said third transistor when the voltage difference between said input signal and said output signal is larger than said prescribed value;
   a fourth transistor that is connected in series to said third transistor and lets said constant reference bias current from said constant current source pass through it independent of said third transistor; and
   a fifth transistor that is connected via a third mirror circuit to said fourth transistor, and feeds a current proportional to a current flowing in said fourth transistor to said second transistor.

8. The amplifier described in claim 6, wherein said switching circuit further comprises:
   a sixth transistor connected between the third transistor and said fourth transistor;

and a diode and a seventh transistor that are connected in series between said third transistor and said fourth transistor and are connected in parallel to said sixth transistor; and wherein said input signal is applied to the control terminal of the sixth transistor; and, together with it, said output signal is applied to the control terminal of said seventh transistor; and, when the voltage difference between said input signal and said output signal is larger than said prescribed value, said diode is ON.

9. The amplifier described in claim 2, wherein said positive feedback circuit for current comprises:
   a fourth transistor connected in series to said third transistor;
   a fifth transistor that is connected in parallel to said constant current source and in series to the second transistor, and forms a third current mirror circuit together with said fourth transistor; and
   a switching circuit that turns ON the fifth transistor when the voltage difference between the input signal and the output signal is larger than the prescribed value.

10. The amplifier described in claim 2, wherein said positive feedback circuit for current comprises:
    a fourth transistor connected in series to said third transistor;
    a fifth transistor that is connected in parallel to said constant current source and in series to the second transistor, and is connected via a third current mirror circuit to said fourth transistor; and
    a switching circuit that turns ON said fifth transistor when said voltage difference between said input signal and said output signal is larger than said prescribed value.

11. The amplifier described in claim 9, wherein: said switching circuit further comprises:
    a sixth transistor connected between said third transistor and said fourth transistor;
    and a diode and a seventh transistor that are connected in series between said third transistor and said fourth transistor and are connected in parallel to said sixth transistor; and
    while said input signal is sent to the control terminal of said sixth transistor, said output signal is sent to the control terminal of the seventh transistor; and, the diode is ON when the voltage difference between said input signal and said output signal is larger than said prescribed value.

12. The amplifier described in claim 1, wherein said amplifier circuit has a differential input part that provides differential input of a pair of input signals, and said constant current circuit feeds said operation current to said differential input part.

13. The amplifier described in claim 1, wherein said amplifier circuit has a differential input part that provides differential input of a pair of input signals and an amplifier part that amplifies a signal output from the differential input part; and the constant current circuit feeds said operation current to said amplifier part.

14. The amplifier described in claim 12, wherein said output signal is fed back to become one of said pair of input signals.

15. The amplifier described in claim 1, wherein said amplification rate is substantially unity.

* * * * *